United States Patent [19]

Vesley et al.

[11] 4,329,384
[45] May 11, 1982

[54] PRESSURE-SENSITIVE ADHESIVE TAPE PRODUCED FROM PHOTOACTIVE MIXTURE OF ACRYLIC MONOMERS AND POLYNUCLEAR-CHROMOPHORE-SUBSTITUTED HALOMETHYL-2-TRIAZINE

[75] Inventors: George F. Vesley, Hudson, Wis.; John D. Moon, Hastings, Minn.

[73] Assignee: Minnesota Mining and Manufacturing Company, St. Paul, Minn.

[21] Appl. No.: 121,403

[22] Filed: Feb. 14, 1980

[51] Int. Cl.$^3$ .................. C08F 2/50; C09J 7/02; B05D 3/06
[52] U.S. Cl. .................. 428/40; 428/345; 428/352; 428/355; 428/913; 204/159.23; 544/216; 427/54.1; 427/177; 427/208.4; 427/372.2; 430/260; 430/281; 430/283; 430/920; 427/331; 430/286
[58] Field of Search .................. 544/216; 204/159.23; 430/920, 281, 283, 260, 286; 428/40, 345, 355, 352, 913; 427/54.1, 177, 208.4, 372.2, 331

[56] References Cited

U.S. PATENT DOCUMENTS 4,181,752  1/1980  Martens et al. ............ 204/159.23 X
4,189,323  2/1980  Buhr ................................. 544/216 X
4,239,850 12/1980  Kita et al. ........................ 204/159.23

Primary Examiner—Marion Mc Camish
Assistant Examiner—Alexander S. Thomas

[57] ABSTRACT

Pressure-sensitive adhesive tape, the adhesive layer of which is produced from a mixture of (1) a pressure-sensitive adhesive alkyl acrylate polymer and (b) a polynuclear-chromophore-substituted halomethyl-s-triazine such as

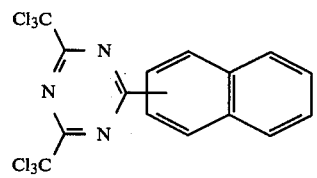

which has been exposed to ultraviolet radiation to cause the polymer to become crosslinked.

19 Claims, No Drawings

PRESSURE-SENSITIVE ADHESIVE TAPE PRODUCED FROM PHOTOACTIVE MIXTURE OF ACRYLIC MONOMERS AND POLYNUCLEAR-CHROMOPHORE-SUBSTITUTED HALOMETHYL-2-TRIAZINE

BACKGROUND TO THE INVENTION

Pressure-sensitive adhesive tape is generally manufactured by coating onto a backing sheet a solution or emulsion of a pressure-sensitive adhesive polymer and heating the coating to drive off the volatile vehicle. Belgian Pat. No. 675,420 which was published May 16, 1966, concerns a process for making pressure-sensitive adhesive tape which evolves essentially no volatiles. While maintaining an inert atmosphere, a mixture of acrylic monomers and a photoinitiator is coated onto a backing sheet and then polymerized with ultraviolet radiation to a pressure-sensitive adhesive state.

U.S. Pat. No. 4,181,752 (Martens et al.) discloses a process for making pressure-sensitive adhesive tape which, like that of Belgian Pat. No. 675,420, involves the photopolymerization of acrylic monomers. While the Belgian patent discloses nothing of the specific intensity and the specific spectral distribution of the irradiation, the Martens patent discloses that these must be controlled in order to attain desirably high cohesive strength and also to attain high peel resistance. It teaches that the polymerizable mixture should be subjected to radiation in the near ultraviolet region at a rate of irradiation in the 300-400 nanometer wavelength range of not more than 7 milliwatts per square centimeter of the mass exposed. Any radiation shorter than 300 nanometers is limited to not more than about 10% of the energy in the 300-400 nanometers wavelength range. Because the same specific intensity and specific spectral distribution of the irradiation are preferred for the practice of the present invention, the disclosure of the Martens patent is here incorporated by reference.

Martens teaches that the pressure-sensitive adhesive layer may be crosslinked, particularly where it is desired to increase the cohesive strength of the adhesive without unduly affecting its compliance. This can be achieved by utilizing a photoactive crosslinking agent in conjunction with the photoinitiator. Preferred as the photoactive crosslinking agent are certain chromophore-substituted vinylhalomethyl-s-triazines such as 2,4-bis(trichloromethyl)-6-p-methoxystyryl-s-triazine which has the formula

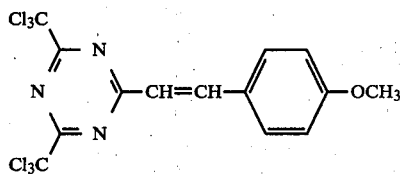

This compound is hereinafter called "MOST".

German Offenlegungsschrift No. 27 18 259 (Buhr) which was laid open Nov. 11, 1978, says that MOST and similar styryl-s-triazines are relatively complicated to prepare. It suggests that equally useful compounds can be prepared more easily, among which are

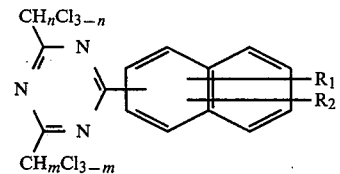

wherein each of $R_1$ and $R_2$ may be, among other things, H or alkoxy, one of $R_1$ and $R_2$ may be Cl or Br, and m and n are integers from 0 to 3 and m+n does not exceed 5. U.S. Pat. No. 4,189,323 is issentially identical to the Offenlegungsschrift.

OTHER PRIOR ART

U.S. Pat. No. 3,779,778 (Smith et al.) teaches that MOST and similar styryl-s-triazines (having at least one trihalomethyl group and at least one chromophoric moiety conjugated with the triazine ring by ethylenic unsaturation) are useful as photolyzable acid progenitors for producing positive acting lithographic plates and the like. U.S. Pat. No. 3,987,037 (Bonham et al.) claims MOST and similar styryl-s-triazines and illustrates uses comparable to those shown in U.S. Pat. No. 3,779,778.

THE PRESENT INVENTION

As does the aforementioned Martens patent, the present invention primarily concerns pressure-sensitive adhesive tape having at least one adhesive layer produced from a photocrosslinkable mixture of acrylic monomers such as alkyl acrylates, especially those which photopolymerize to a pressure-sensitive adhesive state and become crosslinked during the photopolymerization. As in Martens, the photocrosslinkable mixture includes a photoactive agent which is a chromophore-substituted halomethyl-s-triazine, but this differs from MOST in that it has no styryl group, instead having a polynuclear moeity attached directly to its s-triazine ring. The photoactive s-triazine employed in the present invention can be made by a more simple and hence more economical process than can MOST, has better solubility in acrylic monomer mixtures than does MOST, and tends to provide desirably shortened reaction times and somewhat greater tolerance to oxygen. MOST tends to lend a yellowish color whereas the photoactive s-triazine employed in the invention usually produces no observable color.

While the present invention primarily concerns tape produced from (1) photopolymerizable mixtures of acrylic monomers which become crosslinked when subjected to ultraviolet radiation, it also concerns tape produced from (2) photoactive mixtures of acrylic polymers which become crosslinked when subjected to ultraviolet radiation.

Specifically, the present invention concerns a pressure-sensitive adhesive tape comprising a backing member and at least one crosslinked pressure-sensitive adhesive layer produced from a photoactive mixture comprising by weight (a) 50-100 parts of substituted or unsubstituted alkyl acrylate and 0-50 parts of copolymerizable monoethylenically unsaturated monomer; and (b) 0.01 to 2 parts of a polynuclear-chomophore-substituted halomethyl-s-triazine of the formula

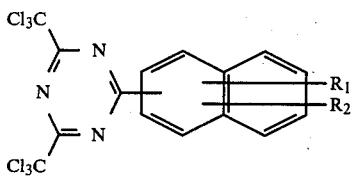

wherein each of $R_1$ and $R_2$ is hydrogen, alkyl (preferably methyl or ethyl), or alkoxy (preferably methoxy or ethoxy). Where $R_1$ is hydrogen, $R_2$ may possibly be chlorine or bromine. Preferably any alkyl or alkoxy group of the photoactive s-triazine component (b) has not more than 12 carbon atoms and no more than two alkyl and alkoxy groups should have more than 6 carbon atoms. Adjacent alkoxy substituents may be interconnected to form a ring. The photoactive s-triazine component (b) may be prepared by the co-trimerization of a polynuclear nitrile with trichloroacetonitrile in the presence of HCl gas and a Lewis acid such as $AlCl_3$, $AlBr_3$ etc. [Bull. Chem. Soc. Japan, Vol. 42, page 2924 (1969)].

When photopolymerizing the above-identified component (a), it may be desirable to do so stepwise. The preferred first step is to mix alkyl acrylate monomer with a photoinitiator which is not a crosslinking agent such that the dissolved amount of the photoinitiator provides up to 0.5% by weight of the mixture.

The second step is to expose the mixture to ultraviolet radiation to provide a partially-polymerized syrup having a viscosity of 300 to 20,000 centipoises at ordinary room temperature. Unless the alkyl acrylate monomer was first at least partially polymerized, the viscosity of the mixture would be too low to provide uniform coatings of thicknesses most useful for pressure-sensitive adhesive tapes, e.g. 25 to 250 micrometers. The partial photopolymerizing may be stopped at any point simply by turning off the ultraviolet radiation.

The third step is to mix with said syrup the above-identified photoactive s-triazine component (b). The modified syrup may be coated onto a backing member and exposed to ultraviolet radiation to complete the polymerization. Alternatively, the third step may be performed using a syrup which has been prepared by conventional thermal polymerization techniques and has been quenched with air to attain the desired viscosity.

When an uncrosslinked polymer of alkyl acrylate monomer is mixed with the photoactive s-triazine component (b) and the mixture is exposed to ultraviolet radiation, the polymer becomes crosslinked. For example, a pressure-sensitive adhesive polymer of an alkyl acrylate which has been polymerized in emulsion or solution may be dissolved in an organic solvent and then mixed with the photoactive s-triazine. After coating this solution onto a flexible backing member and evaporating the solvent, exposure of the coating to ultraviolet radiation causes crosslinking of the polymer. By using an opaque backing member to shield the dried coating from accidental ultraviolet radiation, the uncrosslinked tape may be marketed in commerce and eventually crosslinked by ultimate consumers.

Photoinitiators which are useful for partially polymerizing alkyl acrylate monomer without crosslinking include the benzoin ethers (such as benzoin methyl ether or benzoin isopropyl ether), substituted benzoin ethers (such as anisoin methyl ether), substituted acetophenones (such as 2,2-diethoxyacetophenone and 2,2-dimethoxy-2-phenylacetophenone), substituted alpha-ketols (such as 2-methyl-2-hydroxypropiophenone), aromatic sulfonyl chlorides (such as 2-naphthalene-sulfonyl chloride) and photoactive oximes [such as 1-phenyl-1,1-propanedione-2-(O-ethoxycarbonyl)oxime]. They may be used in amounts which as dissolved provide about 0.001 to 0.5 percent by weight of the alkyl acrylate monomer, preferably at least 0.01 percent.

After adding the above-identified photoactive s-triazine component (b) to alkyl acrylate monomer, whether or not partially polymerized to provide a coatable syrup, the polymerization quickly goes to completion when subjected to ultraviolet radiation, and the polymer simultaneously becomes crosslinked. Although the polymerization is exothermic, coatings as thick as 0.5 mm have been quickly polymerized uniformly. To form from alkyl acrylate monomer uniform, bubble-free layers of greater thickness, either the amount of the photoactive s-triazine component (b) should be kept below about 0.5% by weight of the above-identified composition (a) or the intensity of radiation should be reduced so that polymerization proceeds more slowly.

The extent of polymerization can be monitored by measuring the refractive index of the polymerizable mixture. For example, the refractive index may change from about 1.43 for a partially polymerized syrup to about 1.47 at about 100% reaction. The change in refractive index occurs linearly with conversion of the unsaturated moiety. See, for example, discussions about the method in *Polymerization at Advanced Degrees of Conversion*, G. P. Gladyshev and K. M. Gibov, Keter Press, Jerusalem, 1970.

Alkyl acrylates wherein the alkyl group has 4–12 carbon atoms are readily photopolymerized in the practice of the invention to a pressure-sensitive adhesive state, either alone or in combination with various copolymerizable monoethylenically unsaturated monomers, usually at ratios of about 88–99 parts of the alkyl acrylate or acrylates and correspondingly 12-1 parts by weight of the copolymerizable monomer or monomers. In order to enhance the internal strength of the resultant polymer, at least some of the copolymerizable monomer or monomers should have highly polar groups some as are present in acrylic acid, methacrylic acid, itaconic acid, acrylamide, methacrylamide, N-substituted acrylamides, acrylonitrile, methacrylonitrile, hydroxyalkyl acrylates, cyanoethyl acrylate, N-vinylpyrrolidone, and maleic anhydride. Other useful copolymerizable monoethylenically unsaturated monomers include alkyl vinyl ethers, vinylidene chloride, styrene, and vinyltoluene.

Other materials which can be blended with the photoactive mixture of this invention include tackifiers, reinforcing agents, and other modifiers, some of which may copolymerize with the alkyl acrylate monomer or photopolymerize independently.

Glass microbubbles having an average diameter of 10 to 200 micrometers can be blended with photoactive mixtures of this invention as taught in U.S. Pat. No. 4,223,067 (Levens). If the microbubbles comprise 20 to 65 volume percent of the pressure-sensitive adhesive, the polymerized product will have a foam-like appearance and be suitable for uses to which foam-backed pressure-sensitive adhesive tapes are put.

In the current state of the art, photopolymerization is carried out in an inert atmosphere. Any inert atmosphere such as nitrogen, carbon dioxide, helium or argon is suitable and, as noted above, some oxygen can be tolerated. A sufficiently inert atmosphere can be achieved by covering a layer of the photoactive mixture with a plastic film which is transparent to ultraviolet radiation and irradiating through that film in air.

The peak wavelength of the ultraviolet radiation preferably is close to the wavelength of maximum absorption of the photoactive s-triazine component (b). Good results have been attained using a bank of 40-watt fluorescent black lamps. General Electric and Sylvania each market such a lamp designated "F40BL-Black Light". The GE lamp emits mainly between 310 nm and 430 nm with a maximum at 380 nm. The Sylvania lamp emits mainly between 310 nm and 400 nm with a maximum at 365 nm. Good results have also been obtained with mercury lamps, namely 400 watt and 1000 watt medium-pressure street lights (General Electric HID H400A-33-1). While the fluorescent lamps have been mounted within the chamber which provides an inert atmosphere, the mercury lamps are hotter and were mounted outside the chamber. A sheet of 0.6-cm heat-resistant glass placed 1.3 cm above the coating to be polymerized served to seal the chamber and to filter out radiation below 310 nm.

In using the fluorescent lamps, the operating intensity has usually been adjusted to 2–4 milliwatts/cm$^2$ at a distance of 12.5 cm from the coating. The mercury street lights provided an intensity of about 2 milliwatts/cm$^2$. The intensity of the irradiation was measured with a United Detector Technology 80X Opto-Meter radiometer which had a sandblaster fused silica diffuser, a Kodak 18A filter, and a silicon photodiode. The filter transmitted light between 300 and 400 nanometers. The radiometer was calibrated in accordance with the spectral output of each lamp.

Pressure-sensitive adhesive tapes of the examples below employed as the backing member biaxially-oriented polyethylene terephthalate film having a thickness of about 2 mils (50 micrometers). Each tape was slit to a width of ½ inch (1.27 cm) and had an adhesive thickness of about 2 mils (50 micrometers). Tapes of Examples 1–7 were tested for Peel Value and Shear Value as indicated below. All failures in the tests for Shear Value were cohesive

PEEL VALUE

Tape is adhered by its adhesive to a glass plate under the weight of a 4.5-kg hard rubber roller. Peelback at 180° is measured by attaching the free end of the tape to a scale and moving the glass plate away from the scale at a rate of about 3.8 centimeters per second.

SHEAR VALUE

A strip of tape is adhered by its adhesive to a stainless steel plate under the weight of a 4.5-kg hard rubber roller with a free end of the tape extending beyond the plate and the adhesive contact area being ½ inch by ½ inch (1.27 cm by 1.27 cm). After 30 minutes, the plate is placed in an oven at 70° C. and positioned 2° from the vertical to prevent peeling. After 10 minutes in the oven, a one kg mass is suspended from the free end, and the time at which the mass falls is noted. The test is discontinued if the tape has not failed after 10,000 minutes.

EXAMPLES 1 TO 4 AND COMPARATIVE EXAMPLES C-1 TO C-4

A series of pressure-sensitive adhesive tapes were made by partially photopolymerizing a mixture of, by weight, 90 parts of isooctyl acrylate
10 parts of acrylic acid
0.1 part of 2,2-dimethoxy-2-phenyl acetophenone,
which has the structure $$\phi-\overset{O}{\underset{}{C}}-\overset{OCH_3}{\underset{OCH_3}{C}}-\phi$$

and which was obtained as "Irgacure" 651. The partial photopolymerizing was accomplished in an inert (nitrogen) atmosphere using a bank of 40-watt fluorescent black lights (GE as described above) to provide coatable syrups of a viscosity (Brookfield) of about 1500 cps. A photoactive s-triazine was added to each syrup, sometimes together with additional "Irgacure" 651, and thoroughly mixed. Each mixture was coated using a conventional knife coater onto biaxially-oriented polyethylene terephthalate film. The coated film was passed through an inert (nitrogen) chamber and irradiated with the same fluorescent lamps to provide pressure-sensitive adhesive layers. In addition the examples employed the photoactive s-triazines of Table I:

TABLE I

| Photoactive s-triazine | M.P. °C. | Maximum absorption wavelength in CH$_2$Cl$_2$ (nanometers) | Extinction coefficient $\epsilon \times 10^{-3}$ |
|---|---|---|---|
| MOST | 190–192 | 377 | 28 |
| I (Cl$_3$C–triazine–naphthyl) | 118–120 | 363 | 8.6 |
| II (Cl$_3$C–triazine–naphthyl–OCH$_3$) | 178–180 | 385 | 4.6 |

Structures of the photoactive s-triazines in Table I were confirmed by infrared, nuclear magnetic resonance, and mass spectroscopy. Conditions of the chamber atmosphere, the amount of any additional "Irgacure" 651, the exposure, and the Shear Values in minutes are reported in Table II. All of the tapes had Peel Values of 50–60 ounces per ½ inch (110–130 N/100 mm).

TABLE II

| Example No. | Photoactive s-triazine (Identity) | Photoactive s-triazine (Wgt. %) | Oxygen In Chamber (ppm) | Added Irgacure (Wgt. %) | Exposure (mj) | Shear Value (min) |
|---|---|---|---|---|---|---|
| C-1 | MOST | 0.10 | 100 | 0.15 | 360 | 90 |

TABLE II-continued

| Example No. | Photoactive s-triazine (Identity) | (Wgt. %) | Oxygen In Chamber (ppm) | Added Irgacure (Wgt. %) | Exposure (mj) | Shear Value (min) |
|---|---|---|---|---|---|---|
| C-2 | MOST | 0.10 | 20 | 0 | 450 | 10,000 |
| C-3 | MOST | 0.20 | 20 | 0.25 | 450 | 10,000 |
| C-4 | MOST | 0.10 | 20 | 0.25 | 450 | 1,100 |
| 1 | I | 0.15 | 30 | 0 | 140 | 10,000 |
| 2 | I | 0.1 | 100 | 0.2 | 250 | 470 |
| 3 | I | 0.15 | 100 | 0.2 | 205 | 10,000 |
| 4 | II | 0.2 | 30 | 0.1 | 200 | 10,000 |

EXAMPLE 5 AND COMPARATIVE EXAMPLE C-5

A pressure-sensitive adhesive tape was prepared from a 50% solution in heptane/toluene/methanol 56/24/20 of a 95:5 polymer of 2-ethylhexyl acrylate:acrylamide which had been solution-polymerized to substantially 100% conversion. Photoactive s-triazine I was added to the solution (0.165% of dry weight adhesive) and thoroughly mixed. This was knife-coated [4-mil (0.1 mm) orifice] onto a backing member, dried at 135° C. for 5 minutes, and then irradiated in air using a standard medium-pressure mercury lamp (300 watts/inch) at 30 m/min. (350 mj/cm$^2$). The irradiated tape (Example 5) and an otherwise identical unirradiated tape (Comparative Example C-5) had Shear Values [except measured at room temperature and a contact area of ½ by 1 inch (1.27 cm by 2.54 cm)] of 10,000 and 100 minutes, respectively.

EXAMPLE 6 AND COMPARATIVE EXAMPLE C-6

A polymer of isooctyl acrylate and acrylic acid (95.5:4.5) was prepared by a conventional emulsion-polymerization technique. The polymer was dried and redissolved in 70:30 heptane:isopropanol, 25% solids. To 100 parts of the solution was added 0.05 part of Photoactive s-triazine I, and this was thoroughly mixed. The mixture was knife-coated [10-mil (0.25 mm) orifice] onto a backing member and dried at 70° C. for 5 minutes. The resulting pressure-sensitive adhesive layer was exposed in the presence of air to ultraviolet irradiation as described in Examples. The irradiated tape (Example 6) and an otherwise identical unirradiated tape (Comparative Example C-6) were tested for Peel Value and Shear Value [except ½ by 1 inch (1.25 by 2.54 cm) contact area] with results indicated below:

| Tape of | Peel Value (N/100 mm) | Shear Value (minutes) |
|---|---|---|
| Example 6 | 37 | 10,000 |
| Comparative Example C-6 | 37 | 2 |

EXAMPLE 7 AND COMPARATIVE EXAMPLE C-7

Tapes were prepared from a commercial pressure-sensitive adhesive which is understood to be a copolymer comprising a major proportion of 2-ethylhexyl acrylate and minor proportions of vinyl acetate, ethyl acrylate and acrylic acid (Ashland "Aroset" 1044-Z-40). This was obtained as a 40% solution, diluted with toluene to 20% solids, and Photoactive s-triazine I (0.15% of dry weight adhesive) was added. After thorough mixing, the solution was knife-coated (0.4-mm orifice) onto a backing member and dried at 70° C. for 15 minutes. The resultant tape (Example 7) was irradiated as in Examples 1–4 in comparison to an unirradiated tape (Example C-7) which was identical except that it did not have any photoactive components. Test results were

| Tape of | Shear Value (minutes) |
|---|---|
| Example 7 | 1570 |
| Comparative Example C-7 | 365 |

In each of the pressure-sensitve adhesive tapes of Examples 1 to 7, the adhesive layer was permanently bonded to the polyethylene terephthalate backing member. For many potential uses of the invention, the adhesive layer would be formed on a backing member having a low-adhesion layer from which the adhesive layer could be transferred.

EXAMPLES 8 TO 10 AND COMPARATIVE EXAMPLES C-8 TO C-10

To investigate further the crosslinking ability of the photoactive s-triazines, polymers were prepared by mixing "Irgacure" 651 (identified in Examples 1–4) or Photoactive s-triazine I with various acrylic monomers. Each mixture was purged with nitrogen and irradiated with a bank of 40-watt fluorescent black lights (GE as described above) until substantially complete conversion of the unsaturated moiety. Solubility of the resulting polymers was tested in ethyl acetate after shaking at room temperature for 24 hours. Results are shown in Table III.

TABLE III

| Example No. | Acrylic monomers | Photoactive s-triazine (Wgt %) | Irgacure (Wgt %) | Solubility |
|---|---|---|---|---|
| 8 | isooctyl acrylate | 0.15 | 0 | gel |
| C-8 | | 0 | 0.2 | soluble |
| 9 | Isooctyl acrylate: | 0.15 | 0 | gel |
| C-9 | n-octyl methacrylate (80:20) | 0 | 0.2 | soluble |
| 10 | n-butyl acrylate | 0.15 | 0 | gel |
| C-10 | | 0 | 0.2 | soluble |

We claim:

1. Pressure-sensitive adhesive tape comprising a backing member and at least one adhesive layer produced from a photoactive mixture comprising by weight
   (a) 50–100 parts of alkyl acrylate and 0–50 parts of copolymerizable monoethylenically unsaturated monomer and
   (b) 0.01 to 2 parts of a polynuclear-chromophore-substituted halomethyl-s-triazine of the formula

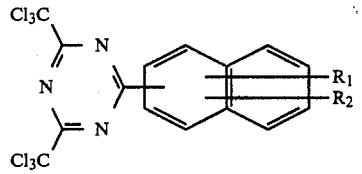

wherein each of R$_1$ and R$_2$ is hydrogen, alkyl, or alkoxy.

2. Pressure-sensitive adhesive tape as defined in claim 1 wherein at least one of R$_1$ and R$_2$ is an alkyl or alkoxy group of up to 12 carbon atoms and not more than two alkyl and alkoxy groups have more than 6 carbon atoms.

3. Pressure-sensitive adhesive tape as defined in claim 2 wherein there are two adjacent alkoxy groups interconnected to form a ring.

4. Pressure-sensitive adhesive tape as defined in claim 1 wherein the s-triazine (b) is

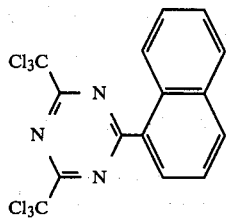

5. Pressure-sensitive adhesive tape as defined in claim 1 wherein the s-triazine (b) is

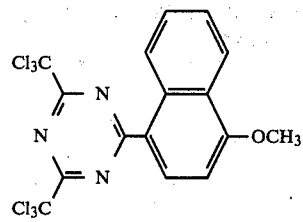

6. Pressure-sensitive adhesive tape as defined in claim 1 wherein (a) comprises (1) 88–99 parts of alkyl acrylate having 4–12 carbon atoms in its alkyl groups or alkyl acrylates having an average of 4–12 carbon atoms in their alkyl groups and (2) correspondingly 12-1 parts of said copolymerizable monomer.

7. Pressure-sensitive adhesive tape as defined in claim 1, the backing member of which is flexible and opaque in order to shield said photoactive mixture from accidental ultraviolet radiation when the tape is wound upon itself into a roll.

8. Pressure-sensitive adhesive tape as defined in claims 1 or 7 wherein at least part of said copolymerizable monomer has highly polar groups.

9. Pressure-sensitive adhesive tape as defined in claim 1, the backing member of which has a low-adhesion layer from which said at least one adhesive layer could be transferred.

10. Pressure-sensitive adhesive tape as defined in claim 9 wherein the copolymerizable monomer having highly polar groups is at least one of acrylic acid, methacrylic acid, itaconic acid, acrylamide, methacrylamide, acrylonitrile, methacrylonitrile, N-substituted acrylamides, hydroxyalkyl acrylates, cyanoethyl acrylate, N-vinylpyrrolidone, and maleic anhydride.

11. Method of making a pressure-sensitive adhesive tape comprising the steps of
(1) mixing by weight
(a) 100 parts of a composition comprising 50–100 parts of alkyl acrylate monomer and 0–50 parts of copolymerizable monoethylenically unsaturated monomer, which composition is polymerizable or has been polymerized to a pressure-sensitive adhesive state and
(b) 0.01 to 2 parts of a polynuclear-chromophore-substituted halomethyl-s-triazine of the formula

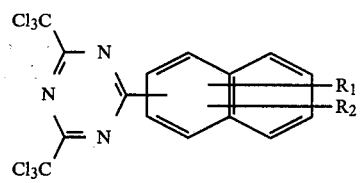

wherein each of $R_1$ and $R_2$ is hydrogen, alkyl or alkoxy,
(2) coating the mixture onto a backing member, and
(3) exposing the coated mixture to ultraviolet radiation.

12. Method as defined in claim 11 wherein said composition (a) has been partially polymerized to a coatable viscosity of 300 to 20,000 centipoises at ordinary room temperature, and in step (3) the coated mixture is photopolymerized.

13. Method as defined in claim 12 wherein said composition (a) comprises (1) 88–89 parts of alkyl acrylate having 4–12 carbon atoms in its alkyl group or alkyl acrylates having an average of 4–12 carbon atoms in their alkyl groups and (2) correspondingly 12-1 parts of said copolymerizable monomer.

14. Method as defined in claim 13 wherein at least part of said copolymerizable monomer has highly polar groups.

15. Method as defined in claim 11 wherein said composition (a) comprises a polymer, step (2) involves coating onto a flexible backing member a solution of said polymer in an organic solvent, there is an additional step between steps (2) and (3) involving driving off the solvent and in step (3) the polymer becomes crosslinked.

16. Pressure-sensitive adhesive tape produced by the method as defined in claim 11.

17. Method of making a pressure-sensitive adhesive tape comprising the steps of:
(1) mixing by weight
(a) 100 parts of an unpolymerized composition of 50–100 parts of alkyl acrylate and 0–50 parts of copolymerizable monoethylenically unsaturated monomer comprising polar groups, which composition is polymerizable to a pressure-sensitive adhesive state, and,
(b) an addition-polymerization photoinitiator which is activatable by ultraviolet radiation, is not a crosslinking agent, and is dissolved in an amount providing 0.001 to 0.5 percent of the composition (a),
(2) exposing the mixture to ultraviolet radiation to provide a partially-polymerized syrup having a viscosity of 300 to 20,000 centipoises at ordinary room temperature,
(3) mixing with said syrup 0.01 to 2 parts of a polynuclear chromophore-substituted halomethyl-s-triazine of the formula

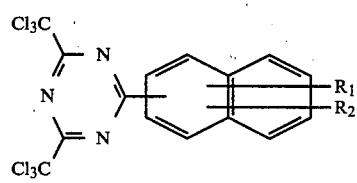

wherein each of $R_1$ and $R_2$ is hydrogen, alkyl, or alkoxy, (4) coating said syrup onto a backing member to provide a layer having a thickness of about 25-250 micrometers, and (5) in an inert atmosphere, irradiating the coating with ultraviolet radiation to further polymerize it to a substantially completely polymerized, crosslinked, pressure-sensitive adhesive state.

18. Method of making a pressure-sensitive adhesive tape as defined in claim 17 wherein said unpolymerized composition comprises (i) 88-99 parts of alkyl acrylate having 4-12 carbon atoms in its alkyl group or alkyl acrylates having an average of 4-12 carbon atoms in their alkyl groups and (ii) correspondingly 12-1 parts of a copolymerizable monomer.

19. Method of making a crosslinkable pressure-sensitive adhesive tape comprising the steps of (1) mixing by weight
(a) a solution in an organic solvent of a polymer of
(i) 88-99 part of alkyl acrylate having 4-12 carbon atoms in its alkyl group or alkyl acrylates having an average of 4-12 carbon atoms in their alkyl groups and (ii) correspondingly 12-1 parts of a copolymerizable monomer and (b) 0.01 to 2 parts of a polynuclear-chromophore-substituted halomethyl-s-triazine of the formula

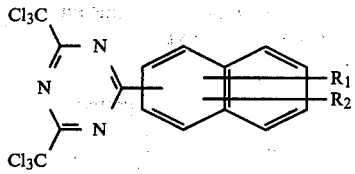

wherein each of $R_1$ and $R_2$ is hydrogen, alkyl, or alkoxy, (2) coating said mixture onto a flexible, opaque backing member to provide a layer having a thickness of about 25-250 micrometers, (3) driving off the solvent, and (4) winding the coated backing member on itself into roll form so that the backing member shields the coating from accidental exposure to ultraviolet radiation which would cause the polymer to become crosslinked.

* * * * *